United States Patent
Aebischer et al.

(10) Patent No.: US 7,830,500 B2
(45) Date of Patent: Nov. 9, 2010

(54) OPTOELECTRIC ANGLE-MEASURING DEVICE

(75) Inventors: Beat Aebischer, Heerbrugg (CH); Heinz Lippuner, Rebstein (CH); Bernhard Braunecker, Rebstein (CH)

(73) Assignee: Leica Geosystems AG, Heerbrugg (CH)

( * ) Notice: Subject to any disclaimer, the term of this patent is extended or adjusted under 35 U.S.C. 154(b) by 291 days.

(21) Appl. No.: 12/091,680

(22) PCT Filed: Oct. 28, 2006

(86) PCT No.: PCT/EP2006/010398

§ 371 (c)(1),
(2), (4) Date: Apr. 25, 2008

(87) PCT Pub. No.: WO2007/051575

PCT Pub. Date: May 10, 2007

(65) Prior Publication Data

US 2008/0291434 A1    Nov. 27, 2008

(30) Foreign Application Priority Data

Nov. 4, 2005    (EP) ................................ 05110357

(51) Int. Cl.
*G01B 11/26* (2006.01)
(52) U.S. Cl. ...................................................... 356/138
(58) Field of Classification Search ........................ None
See application file for complete search history.

(56) References Cited

U.S. PATENT DOCUMENTS

| 4,465,373 | A | * | 8/1984 | Tamaki et al. ............... 356/617 |
| 4,752,126 | A |   | 6/1988 | Fujii et al. |
| 5,214,426 | A | * | 5/1993 | Minohara et al. ............. 341/13 |
| 2002/0018220 | A1 | | 2/2002 | Aoki |

FOREIGN PATENT DOCUMENTS

EP    1365207    11/2003

OTHER PUBLICATIONS

Someya T et al: "A large-area, flexible, and lightweight sheet image scanner integrated with organic field-effect transistors and organic photodiodes" Electron Devices Meeting, 2004. IEDM Technical Digest. IEEE International San Francisco, CA, USA Dec. 13-15, 2004, Piscataway, NJ, USA, IEEE, 12. Dec. 2004, Seiten 362-368, XP010788788 ISBN: 0-7803-8684-1.

* cited by examiner

*Primary Examiner*—Tu T Nguyen
(74) *Attorney, Agent, or Firm*—Workman Nydegger (57) ABSTRACT

An optoelectric angle-measuring device has a code carrier having a position code which can be detected optically as well as a scanning device in the form of a light-sensitive row or area for detecting the position code and generating a position-dependent scanning signal. The scanning device which is in the form of a scanning film, in particular, surrounds the code carrier or the code carrier essentially completely surrounds the scanning device along a circumference. This provides an extremely accurate angle-measuring device by virtue of the fact that a large part of the position code, in particular even the entire position code, can be detected.

16 Claims, 6 Drawing Sheets

OPTOELECTRIC ANGLE-MEASURING DEVICE

The invention relates to an optoelectric angle-measuring device for determining at least one angle around at least one axis.

BACKGROUND

The determination of directions and angles is required in many areas of use, such as, for example, in geodetic and industrial surveying. Developments in angle measuring technology range via mechanical reading processes to fully automated angle measurement in the prior art today. With automation, higher accuracies of measurement are achievable, observation times can be shortened and measured values can be stored directly and can be further processed in digital form.

Known angle-measuring devices generally comprise a so-called graduated circle and a scanning device. The graduated circle is in the form of a code carrier and has a graduation or coding for position determination on the circle. An apparatus formed for angle determination with graduation or coding is referred to below as code carrier or as graduated circle. The coding is applied to one surface—circle or lateral surface—of the code carrier.

For automatic determination of the angle values, the code carrier rotatable relative to the scanning device around an axis is scanned by means of different techniques. Known scanning methods are electronic-magnetic, electrical and optoelectronic methods. The following embodiments relate to optoelectronic scanning methods and scanning devices.

For determining angle positions from 0° to 360°, the coding is usually arranged in a full circle. The angular resolution of the full circle is determined by the type of coding and by the scanning device used for reading the coding. Thus, the angular resolution is increased, for example, by applying a code in a plurality of tracks or by a finer graduation, the achievable resolution being limited for manufacturing and cost reasons. For example, arrangements of one or more scanning elements on the graduated circle are known for reading the code. CCD line arrays or CCD area arrays may represent, for example, such scanning elements.

Since such scanning devices can in each case scan only a small code region, various methods and apparatuses have been developed for achieving the required accuracies of measurement—which are, for example, in the region of <3 mgon for geodetic applications. Thus, it is in particular usual to combine a coarse measurement with a precise measurement or to achieve the required resolution by interpolation and computational evaluation and to reduce errors of measurement. Angle-measuring apparatuses in this context comprise, for example, additional codings, scanning grids or a plurality of scanners for multiple scanning. However, such known solutions are technically complex and expensive or represent compromises between accuracy of measurement and speed of measurement.

SUMMARY

An object of the invention is to provide an angle-measuring device which permits a reduction of technical complexity while maintaining the generically required accuracy of measurement.

According to the invention, an angle-measuring device comprising a code carrier, which carries an optically detectable position code, and a scanning device in the form of a light-sensitive line or area is provided, a relatively large coded region of the code carrier, in particular even the total coded region, being simultaneously detectable by means of the scanning device. Thus, firstly the position determination is possible with a less complex code and secondly it is possible to obtain redundancy information by detecting a larger range than is required for unambiguous position determination. By means of the additional measured information, a reliable measurement is ensured. Furthermore, the accuracy of measurement is increased with the detection of a larger code region—optionally of 360°—for example by integration over a larger number of measured values.

The detection of the coded region as described above is effected by means of the scanning device which is formed in such a way that it is arranged along an inner or outer circumference—which carries the code—of the code carrier so that the scanning device substantially completely surrounds the code carrier or the code carrier substantially completely surrounds the scanning device. Advantageously, the scanning device completely surrounds the code carrier or the code carrier the scanning device along at least one circumference. In the context of the invention, a region of the code is also to be understood as meaning a single point- or line-like element, such as a bar.

The arrangement of code carrier and scanning device is such that a relative rotational movement between them is permitted. The rotational movement takes place around at least one axis of the code carrier and/or of the scanning device. In general, code carrier and scanning device surround the same axis. The code carrier is arranged, for example, to be rotatable about an axis—axis of rotation—and rotates together with an element whose angular position is to be detected, while the scanning device is in a fixed position, or the scanning device rotates while the code carrier is fixed.

The code carrier or graduated circle has in particular a geometrical shape with circular cross-section, for example the shape of a cylinder or hollow cylinder. The code carrier may also be in the form of a segment of a circle. It may be produced from glass, plastic or other optically transparent material, and also from non transparent material having slits and/or holes. The formation from optically non transparent material is also possible if the optical measurement is effected by means of optical signals reflected by the code carrier. In an advantageous embodiment of the invention, an optically detectable position code is applied to a circumferential area/lateral area—parallel to the axis—of the code carrier. The term position code summarises optically detectable means, it being possible to produce a position-dependent signal by optical detection of the means. The position dependency can be derived from the coding or from the detection position. An absolute or relative position value can be determined subsequently—indirectly or directly—on the basis of the signal.

The position code may be composed from a plurality of marks a distance apart in the circumferential and/or axial direction or of only a single mark. A line graduation applied to the lateral surface or let into the surface as a position code provides a code carrier for the measurement of relative values in the case of incremental line graduation. Often, such a code carrier is provided with a coarse and a fine graduation. A code carrier formed to give absolute measured values is designed with an absolute code. The code can be arranged or, in particular by means of photolithography, applied in one or more concentric tracks on the lateral surface of the code carrier. Likewise, the lateral surface may have a code extending in the circumferential and axial direction, for example a code surrounding the axis spirally.

The possibilities for design for the coding of the code carrier are increased with the scanning device and the code carrier of the angle-measuring device according to the invention, which are arranged relative to one another along a circumference, in particular a full circumference. Thus, the type of coding can be chosen according to points of view of complexity, cost-efficiency, precision of measurement and/or error detection.

For example, the angle-measuring device comprising the scanning device which is arranged along an inner or outer code-carrying circumference of the code carrier in such a way that a larger angle range, in particular 360° or virtually 360°—or as many degrees as the arrangement permits (cf. for example FIG. 6A)—of the code carrying circumference is detectable can have a substantially simplified code carrier or code. In the case of a 360° scanning device, the code can even be reduced to a point or a line. After calibration of the scanning device, it is possible to derive the position information from the detection position of the position code on the scanning device, it being possible for the position code to be in the form of a single code element, such as the line, or the code carrier itself can be designed as a line element.

By detection of the relatively large, in particular of the total, code-carrying code carrier region, angle measurements can be carried out with higher precision. In the case of incremental code, it is furthermore possible always to determine a correspondingly characterized start and end position. Sources of error, such as, for example, circle graduation errors, can also be determined and appropriately corrected by mapping of the total or substantially total graduated circle coding. In the case of total mapping, a unique code assignment is also always ensured, with the result that—as mentioned above—code elements can be dispensed with. In angle-measuring devices according to the invention, it is therefore possible to use code carriers having less complex codes, which facilitates production and reduces costs.

The position code of the code carrier is projected by optical radiation, for example provided by an illumination device, on the light-sensitive scanning device. The scanning device in the form of the light-sensitive line has light-sensitive regions arranged in the form of lines in the circumferential direction. The light-sensitive area is formed by regions arranged in the form of lines in the circumferential and axial direction of the code carrier, in particular in the form of a matrix.

The light-sensitive regions are, for example, light-sensitive organic photodiodes. By the formation of a transparent polymer matrix having a multiplicity of organic photodiodes, it is possible to provide a flexible transparent or partly transparent scanning film. If the film is arranged to correspond to the code carrier, optical radiation incident on the code carrier is detected—depending on the design of the code carrier and of the code—as reflected or transmitted radiation by the light-sensitive regions. For example, reflected or transmitted light is received by a multiplicity of organic photodiodes as light-sensitive regions and output as electrical voltage. The voltage values can subsequently be digitised and can be further processed as digital values. Since such scanning films can be mass produced, the result is an extremely economical and nevertheless highly precise scanning device.

A scanning film suitable as a scanning device is described, for example, in the article "Pocket scanner has curved surfaces wrapped up" which appeared on pages 22 and 23 in the February 2005 edition of the science magazine OLE (Opto & Laser Europe), the content of which is hereby incorporated into this application. The scanning film also referred to as "sheet image-scanner" or "image-scanner film" is in the form of a thin plastic film. The film may be, for example, a two-layer film composed of a first film having a field of light-sensitive organic photodiodes and a second film having a field of organic transistors, the films being connected by means of silver paste. The photodiode matrix and the transistor matrix have in each case a multiplicity—for example thousands—of photodiodes and transistors. The matrices are placed one on top of the other so that sensor cells, each having a photodiode and a transistor, are formed. This use of organic semiconductors offers a possibility of simple and large-area production, for example by means of printing or vapour deposition techniques, and a robust and flexible end product. The scanning film is also described in the article "A Large-Area Flexible and Lightweight Sheet Image Scanner Integrated with Organic Field-Effect Transistors and Organic Photodiodes" by T. Someya et al., published in IEEE International Electron Devices Meeting Digest of Technical Papers (IEDM), pages 365-368, December 2004, the content of which is hereby incorporated into this application.

As mentioned above, the scanning device is arranged relative to the coded area of the code carrier in such a way that the scanning device substantially completely surrounds the coded region or the coded region substantially completely surrounds the scanning device. In the case of a surrounding scanning device, the term surround is to be understood as meaning an arrangement in which a circumferential area of the scanning device surrounds a circumferential area of the code carrier in such a way that the surrounded circumferential area of the code carrier projects into the space defined by the circumferential area of the scanning device and the two circumferential areas are opposite one another a distance apart without touching and form an intermediate space. The complete surrounding of two 360° circumferential areas can be represented in cross-section by two concentric circles.

The possibilities of arranging the scanning device and code carrier comprise, for example, a scanning device surrounding the code carrier along the total circumference thereof. Likewise, the code carrier can surround the scanning device along the circumference thereof. In one embodiment of the invention, the scanning device is integrally formed and completely surrounds the code carrier along the circumference thereof. In particular, the scanning device surrounds the code carrier at least along a circumferential region relevant for the angle measurement. Complete or substantially complete surrounding can also be realised with a multi-part scanning device if the plurality of parts are arranged in a row or a slight distance apart and as such act as an integral scanning device. Furthermore, it is also possible to provide a plurality of scanning devices which are arranged in particular transversely to the circumferential direction in order, for example, to detect coarsely and finely coded tracks and/or a relative movement deviating from the rotational movement. In their area parallel to the axis of rotation, code carrier and scanning device may correspond to one another or differ. Movements in the direction of the axis of rotation are detectable with a scanning device whose dimension surpasses that of the code carrier.

The optical detection of the position code by means of ambient light is possible for an optoelectronic angle-measuring device according to the invention which receives a correspondingly large amount of ambient light and comprises code carrier and scanning device. However, since an angle-measuring device is generally integrated into a measuring apparatus, an illumination device should generally be provided. This can be arranged centrally in an optically transparent or partly transparent code carrier and can therefore illuminate it from the inside. The scanning device arranged on the outside around the circumference of the code carrier detects transmitted light—the scanning is then effected by means of the so-called transmitted-light method. In the transmitted-light method, the code carrier—for example a glass cylinder—is coded with regions transparent to light and regions opaque to light. The coding is illuminated from one side; the scanning device is arranged as a receiving device on the other side. The code carrier is therefore present between illumination device and receiving device. In contrast, however, it is also possible to use the so-called reflected-light method for scanning. For the reflected-light method, illumination and receiving device are arranged on the same side of the code carrier. This is formed so as to be partly reflecting or has different reflection properties so that different beam intensities are registered.

If the scanning device is optically transparent or partly transparent, for example with regions transparent to light between the light-sensitive regions, the reflected-light technique can also be used in that the code carrier is illuminated through the at least partly transparent scanning device. The illumination can also be effected obliquely into the space between code carrier and scanning device. Some possibilities for illumination or arrangement of the illumination are shown as working examples in the figures.

The choice of the illumination device—such as laser diode, optical fibre, diffuse radiation—is made by the person skilled in the art in particular according to points of view relating to production and/or costs. The choice will also depend in general on the desired arrangement of the illumination device relative to code carrier and scanning device.

A field of use for angle-measuring devices according to the invention comprises geodetic measuring instruments having the function of direction and angle determination. Thus, for example, theodolites can be equipped with horizontal and vertical graduated circle and corresponding reading devices in order to be able to measure horizontal and vertical angles with very high accuracy.

BRIEF DESCRIPTION OF THE DRAWINGS

The angle-measuring device according to the invention is described in more detail below purely by way of example with reference to working examples shown schematically in the drawings. Specifically.

DETAILED DESCRIPTION

Figure 1A:
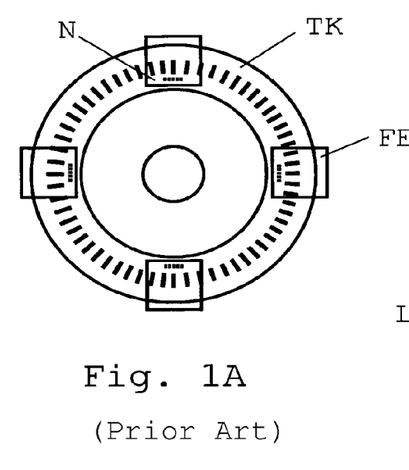
FIG. 1A shows a first angle-measuring device according to the prior art having four scanning units.

FIG. 1A shows an arrangement for setting angular positions according to the prior art. The arrangement has a graduated circle TK having an incremental line graduation and four zero marks N and four scanning units. The two pairs of photo elements FE diametrically opposite one another as scanning units and the two pairs of zero marks N opposite one another are provided for setting accurate angular positions, in particular for avoiding cyclical periodic errors.

Figure 1B:
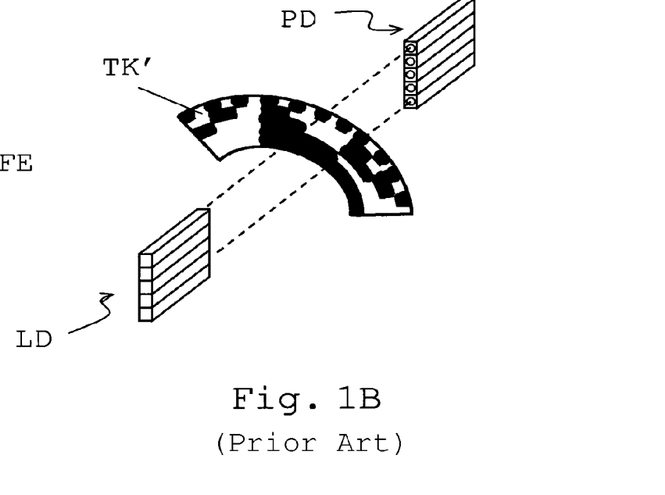
FIG. 1B shows a second angle-measuring device according to the prior art having five luminescence diodes and photodiodes.

A further optoelectronic angle-measuring arrangement according to the prior art is shown in FIG. 1B. The angle-measuring arrangement is formed for coarse absolute angle measurement. For this purpose, a graduated circle TK' is designed with five concentric code tracks. For scanning the tracks, five luminescence diodes LD and five photodiodes PD are arranged perpendicularly to the circumferential direction on opposite sides of the circle as light barriers. Depending on the light transmittance or light opacity of the respective code track, a signal (light/dark) is produced and therefrom a binary character (1/0).

Figure 2:
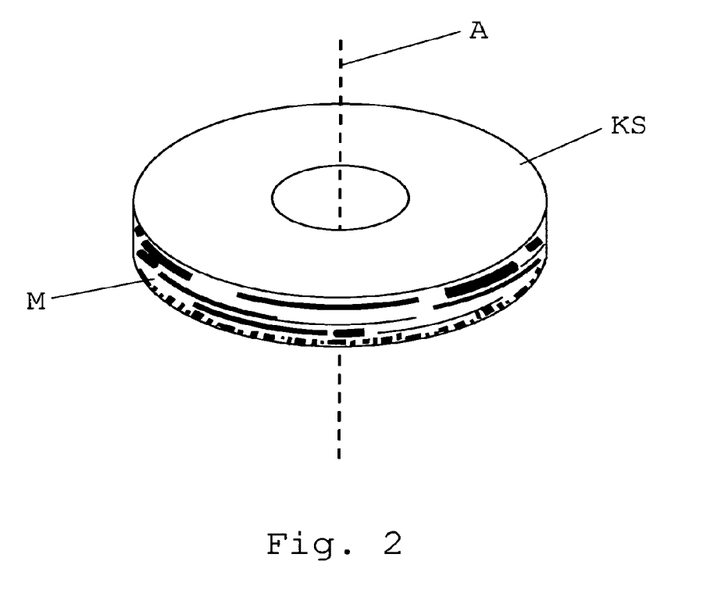
FIG. 2 shows an embodiment of a code carrier for an angle-measuring device according to the invention.

FIG. 2 shows an embodiment of a code carrier which can be used in an angle-measuring device according to the invention. The code carrier is in the form of a circular disc KS rotatable around an axis A, the code being applied along the circumferential area—lateral area M—of the circular disk KS. The code is represented—also below—purely by way of example.

FIGS. 3A-3J show angle-measuring devices according to the invention with different formations and arrangements of code carrier and scanning device and are described in relation to one another.

Figure 3A:
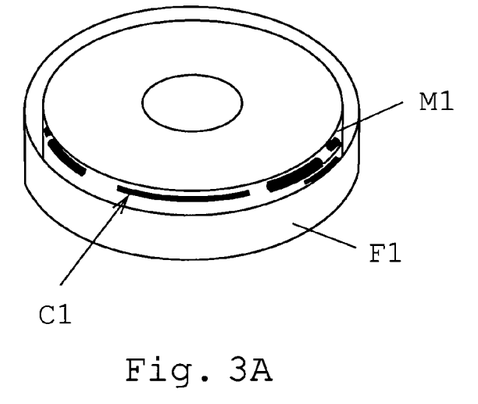
FIG. 3A-3J show embodiments of angle-measuring devices according to the invention having alternative arrangements and formations of code carrier and scanning device.
Figure 3B:
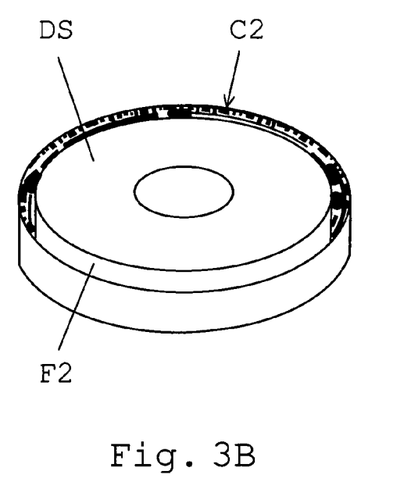

In FIG. 3A, the code carrier is in the form of a disc with position code C1 applied to the circumferential area/lateral area M1. A light-sensitive, planar scanning film F1 as the scanning device surrounds the code carrier along its total circumference. FIG. 3B shows a code carrier which surrounds the scanning film F2 in the form of a light-sensitive area along its total circumference—the scanning film F2 is arranged along the inner circumference of the code carrier, the scanning film being fastened here to the circumferential area/lateral area of a rotating disc DS. The rotating disc DS can optionally comprise further electronics, such as memory electronics and/or evaluation electronics. The code carrier accordingly carries the position code C2 along its inner circumference. Code carrier and scanning film F1 and F2 in FIGS. 3A and 3B are arranged in each case concentrically so that the circumferential area of the code carrier lies in the space (FIG. 3A) defined by the circumferential area of the scanning film F1 or the circumferential area of the scanning film F2 lies in the space defined by the circumferential area of the code carrier (FIG. 3B), code carrier and scanning film F1 and F2 being separated by a space. The scanning films F1 and F2 are in each case integral and have a multiplicity of organic photodetectors arranged in matrix form and not shown here; the code carrier material here is plastic.

Figure 3C:
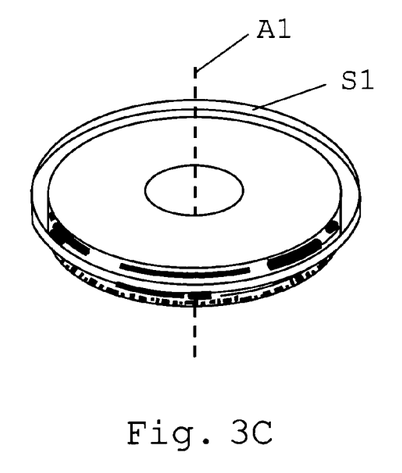
Figure 3D:
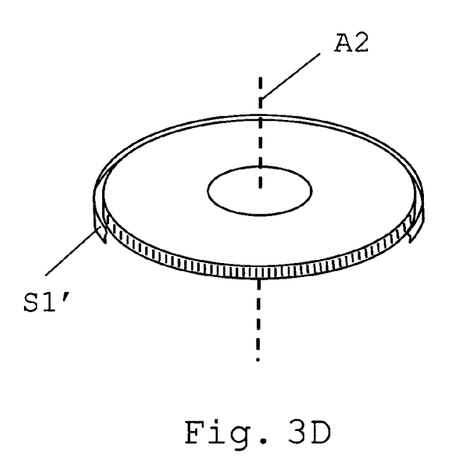
Figure 3E:
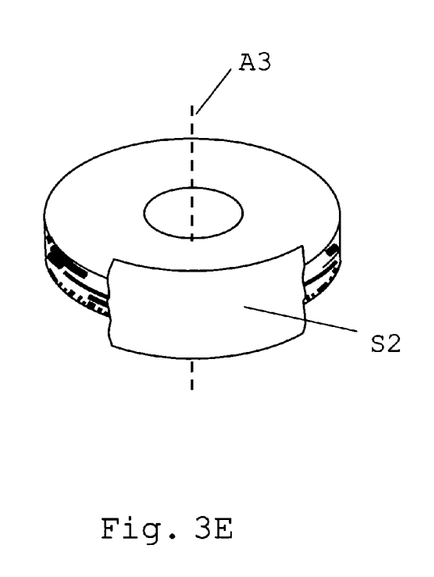

In FIGS. 3C to 3E, a plastic film having light-sensitive regions is arranged around a code carrier, plastic film and code carrier being arranged in each case around an axis A1 or A2 or A3. The plastic film S1 in the form of a light-sensitive line from FIG. 3C is arranged around the total circumference of the code carrier and has a smaller dimension in the axial direction than the code carrier.

The code carrier shown in FIG. 3D on the other hand is likewise in the form of a line and is surrounded on its total circumference by the line-like scanning device S1' formed with a multiplicity of light-sensitive sensor cells with organic photodiodes and organic transistors. Such an embodiment provides an arrangement having very small axial dimensions. Here, a line graduation is applied as an incremental code to the code carrier.

The dimension of the planar film S2 from FIG. 3E in the axial direction is greater than that of the code carrier. With this embodiment, undesired movements of the code carrier in the direction of the axis A3 are particularly readily detectable.

In all FIGS. 3C, 3D and 3E, the scanning device therefore surrounds the code carrier so that the code carrier lies in the space defined by the circumferential area of the scanning device. The space defined by the circumferential area is the space enclosed by the circumferential area, which space also encloses the axis A1 or A2 or A3 of the code carrier or of the scanning device. Thus, the angle-measuring device according to the invention may be formed and arranged according to the desired/preferred property—e.g. accuracy of measurement, compactness of the arrangement, costs and complexity of production.

FIGS. 3F to 3J also show further embodiments of code carrier and scanning device, the scanning device completely surrounding the code carrier along at least one circumference.

Figure 3F:
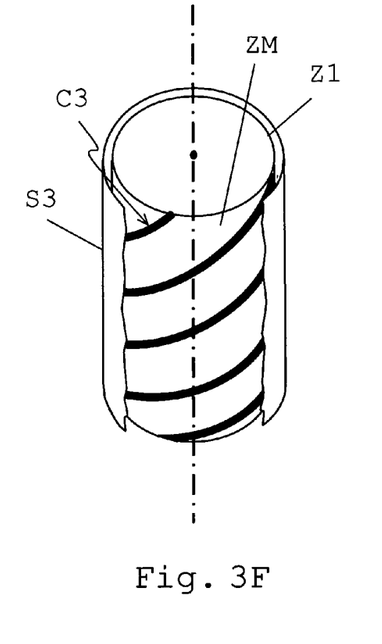

In FIG. 3F the code carrier is in the form of a cylindrical rotating body Z1 which carries a spiral code C3 as a position code on the lateral area ZM of the cylinder. A detection film S3 as a scanning device surrounds the rotating body Z1 along its total height and along its total circumference.

Figure 3G:
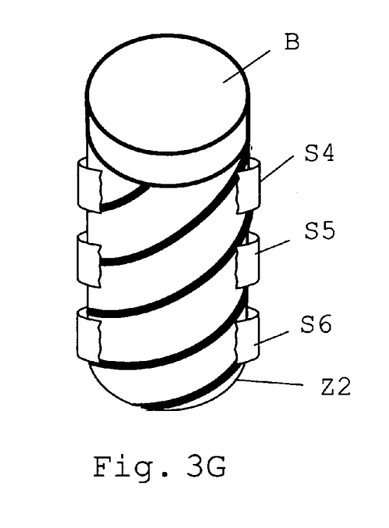

In FIG. 3G, three scanning devices are arranged around a hollow cylindrical code carrier Z2. The scanning devices are in the form of films S4, S5 and S6, each of the films S4, S5 and S6 having a field of organic photodiodes and a coinciding field of organic transistors. The films S4, S5 and S6 completely surround the hollow cylindrical code carrier Z2 along its circumference and are arranged a distance apart transversely to the circumferential direction. Furthermore, an illumination element B is shown. The illumination element B has a roughened, optically transparent base plate so that light of a light source of the illumination device B is scattered diffusely into the interior of the hollow cylinder through the base plate acting as a diffusor. Thus, the code carrier is homogeneously illuminated from the inside and scanned by means of the transmitted-light method using the films S4, S5 and S6. In comparison to the previous embodiments, the embodiments of code carrier and scanning device of FIGS. 3F and 3G have a smaller diameter and a greater extension in the axial direction. Elongated illumination devices, for example optical fibres, can also optionally be used for such a formation of an angle-measuring device according to the invention.

Figure 3H:
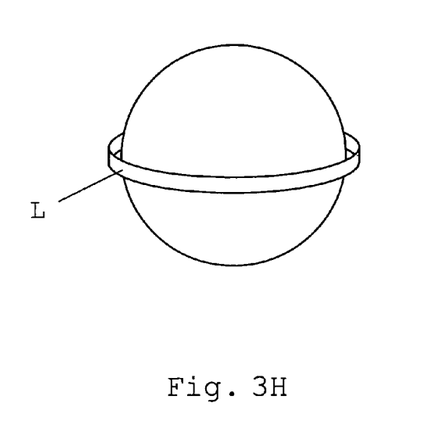
Figure 3I:
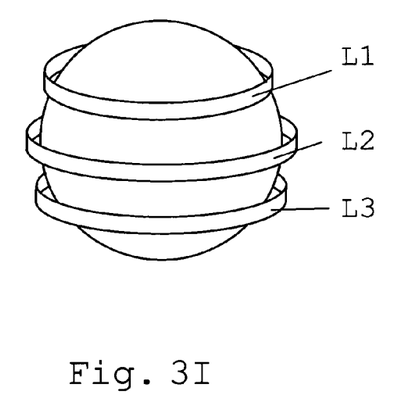
Figure 3J:
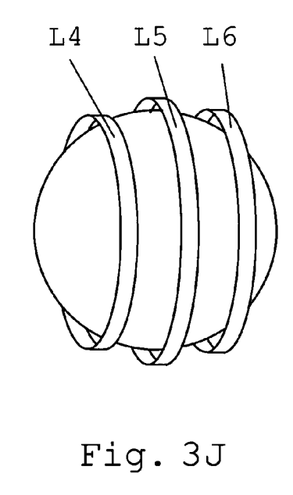

FIGS. 3H, 3I and 3J show spherical code carriers having scanning devices in the form of light-sensitive lines. The code applied to the respective code carrier is not shown. Mounting of the respective code carriers is also not shown—the code carriers are mounted, for example, as ball joints. The scanning line L from FIG. 3H completely surrounds the code carrier along a circumference. In FIG. 3I, a first scanning line L1 is arranged around a first circumference, a second scanning line L2 around a second circumference and a third scanning line L3 around a third circumference of the code carrier. FIG. 3J likewise shows three scanning lines L4, L5 and L6 which surround the code carrier in each case along a circumference and are arranged a distance apart transversely to the circumferential directions.

FIGS. 4A to 4D show illumination devices for an angle-measuring device according to the invention in a plurality of variants of the arrangement. The illumination devices are shown purely by way of example as light emitting diodes—of course, it is possible to use a very wide range of radiation sources, and the illumination devices can also be formed very differently and may comprise, for example, further optical elements, such as lenses or diffusers.

Figure 4A:
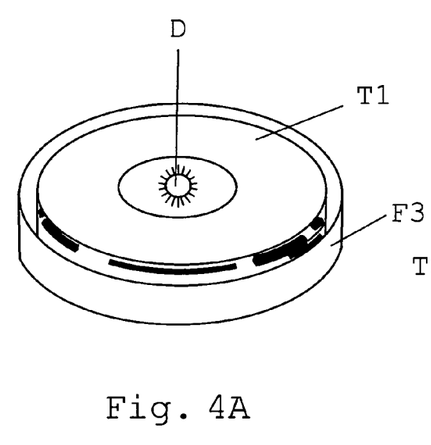
FIG. 4A-4D show, in four partial figures, possible arrangements of illumination devices of angle-measuring devices according to the invention.

The graduated circle T1 from FIG. 4A is illuminated from the inside. The material of the graduated circle T1 here is glass. For protection of the code, the glass circle can be covered with a protective layer or a protective glass can be adhesively bonded on top. The circle is uniformly illuminated by the light emitting diode D arranged centrally within the circle. Light passes from the inside through the circle to the outside in the direction of the light-sensitive scanning film F3, which receives the light signals influenced by the code. An alternative illumination form for such an arrangement can be realised with a self-illuminating code which has, for example, organic light emitting diodes.

Figure 4B:
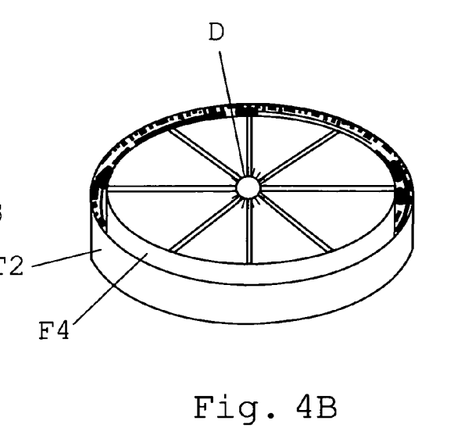

In FIG. 4B, the graduated circle T2 surrounds the inner scanning film F4 concentrically. Once again, the illumination takes place from the centre of the arrangement. The scanning film F4 has regions transparent to light between life-sensitive sensor elements opaque to light, so that light of the centrally positioned light emitting diode D passes through the film to the lateral surface of the graduated circle T2 and is reflected there. The light-sensitive regions—sensor elements—of the film receive the reflected radiation as a position-dependent scanning signal.

Figure 4C:
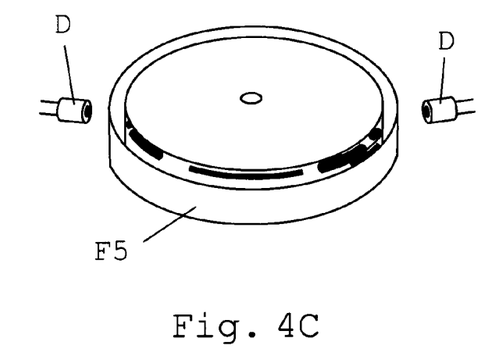

FIG. 4C shows a diagram with outer illumination. Two light emitting diodes D are positioned along the circumferential area of the measuring device and illuminate the code through the film F5 which in turn is formed to be optically partly transparent and receives the signals reflected by the code structure.

The illumination device from FIG. 4B comprises two light emitting diodes D which, for illuminating hollow circular code carrier H and film F6, emit obliquely into the intermediate space thereof. This type of illumination once again corresponds to the reflected-light method—the obliquely incident radiation is reflected by the—coded—inner circumference of the hollow circle to the film F6.

Figure 4D:
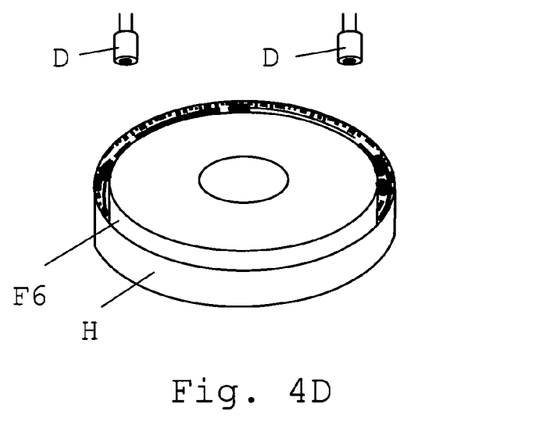

Of course, it is just as possible to use a single light source or a plurality of light sources as an illumination device in the working examples of FIGS. 4C and 4D.

FIGS. 5A to 5D purely schematically show four working examples for possible arrangements of code carrier and scanning device of an angle-measuring device according to the invention. Of course, a multiplicity of further alternative arrangements is possible.

Figure 5A:
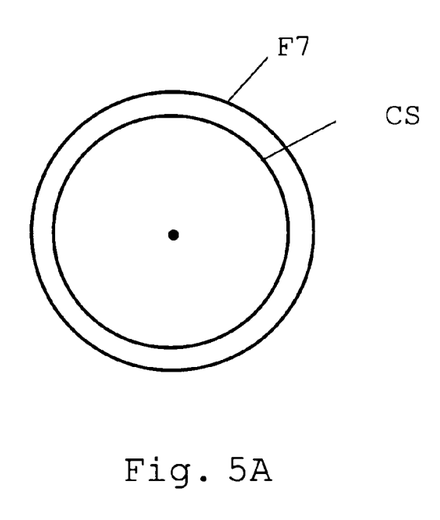
FIG. 5A-5D schematically show, in four partial figures, possible arrangements of code carrier and scanning device.
Figure 5B:
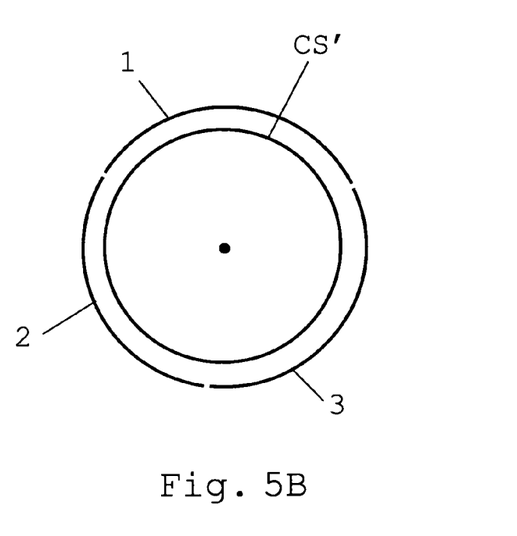
Figure 5C:
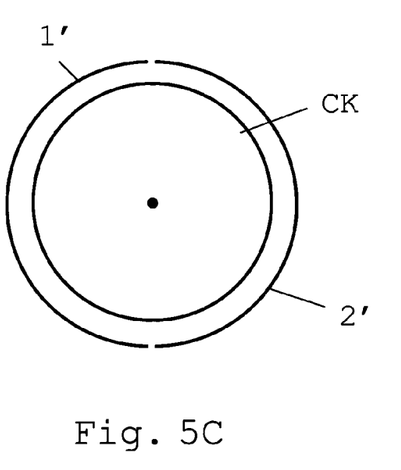
Figure 5D:
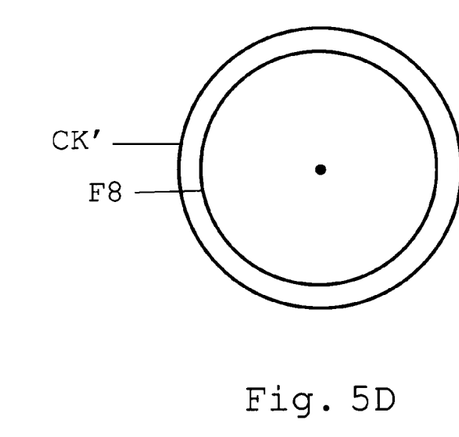

FIG. 5A shows an integral scanning device F7 completely surrounding the code carrier disc CS. In FIG. 5B, the scanning device has three-part formation and is arranged around the code disc CS' in such a way that each of the three parts 1, 2 and 3 surrounds the code disc CS' along a partial circumference thereof in each case in a surrounding angle, the total surrounding angle being virtually 360°, so that the code disk CS' is substantially completely surrounded along its circumference. FIG. 5C shows a scanning device comprising two parts 1' and 2', which laterally surround half the cylindrical code body CK in each case so that the code body CK is substantially completely surrounded by the scanning device. The respective surrounding angle of the parts 1' and 2' is virtually 180° here. The parts could also in each case surround exactly 180° so that the scanning device comprises two parts but acts as an integral scanning device which completely surrounds the code carrier along a circumference. FIG. 5D shows an alternative arrangement with hollow cylindrical code body CK' which completely surrounds the—inner—scanning device F8. The complete surrounding increases the resolution of the measurement by making it possible to integrate over the total code.

Figure 6A:
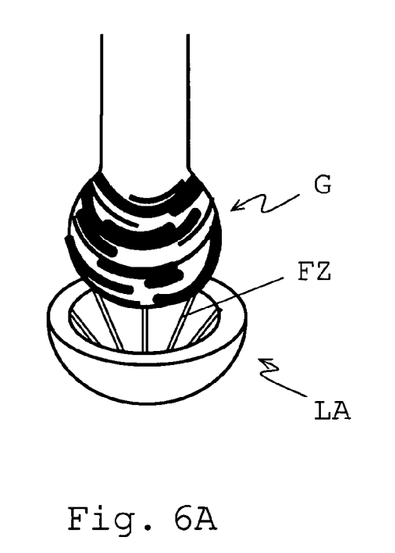
FIG. 6A shows a first working example of an angle-measuring device according to the invention for measurement of the angular position of a ball joint.
Figure 6B:
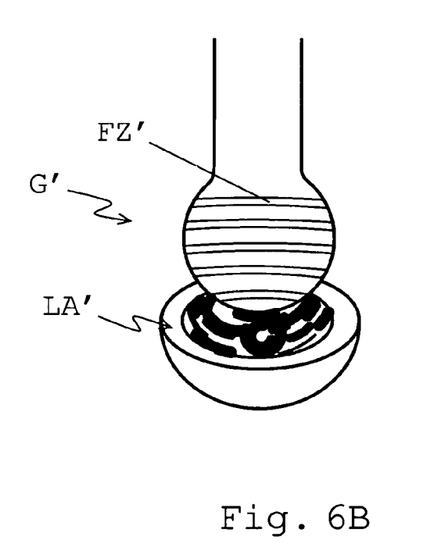
FIG. 6B shows a second working example of an angle-measuring device according to the invention for measurement of the angular position of a ball joint.

FIGS. 6A and 6B show two working examples of an angle-measuring device according to the invention, by means of which embodiments the angular position of a ball joint in a corresponding bearing can be determined. In FIG. 6A the ball joint G is in the form of a code carrier and the bearing LA with film lines FZ which in each case substantially surround the ball joint along a circumference is in the form of a scanning device. In FIG. 6B, the bearing LA' is the code carrier and the joint G' surrounded by film lines FZ' is the scanning device. The respective film lines can of course also be arranged along an alternative or further circumference—for example transversely to the direction shown in each case.

The design of a ball joint with scanning film elements can also be effected with a ball joint having groove-like indentations by introducing film elements into the indentations. It is also possible to arrange code elements at staggered depths. The design of the bearing with film or code elements can be effected in an analogous manner. With such embodiments, bearing friction of the film and code elements can be avoided.

We claim:

1. An optoelectric angle-measuring device for determining at least one angle around at least one axis, comprising:
    a code carrier which surrounds the axis and carries an optically detectable position code; and
    at least one scanning device in the form of a light-sensitive line or area, by means of which scanning device the position code can be detected and a position-dependent scanning signal, which is linked to the angle between the code carrier and the scanning device, can be produced, wherein:
        the scanning device substantially completely surrounds the code carrier along at least one circumference thereof, or the code carrier substantially completely surrounds the scanning device along at least one circumference thereof; and
        the scanning device is integral.

2. An optoelectric angle-measuring device according to claim 1, wherein the scanning device has a multiplicity of organic photodetectors.

3. An optoelectric angle-measuring device according to claim 2, wherein the organic photodetectors include photodiodes or photocells.

4. An optoelectric angle-measuring device according to claim 2, wherein the scanning device has a field of organic photodiodes and a coinciding field of organic transistors.

5. An optoelectric angle-measuring device according claim claim 1, wherein the scanning device is in the form of a flexible scanning film.

6. An optoelectric angle-measuring device according to claim 1, wherein a plurality of scanning devices arranged a distance apart transversely to the circumferential direction are provided.

7. An optoelectric angle-measuring device according claim claim 1, wherein the position code is applied to a lateral area of the code carrier.

8. An optoelectric angle-measuring device according to claim 1, wherein the position code is in the form of an incremental or absolute code.

9. An optoelectric angle-measuring device according to claim 1, wherein the position code is in the form of a spiral code which encloses the axis and extends along the axis.

10. An optoelectric angle-measuring device according to claim 1, further comprising an optical illumination device for indirect and/or direct illumination of the code carrier.

11. An optoelectric angle-measuring device according to claim 10, wherein the illumination device has one or more light sources.

12. An optoelectric angle-measuring device according to claim 11, wherein the one or more light sources include light emitting diodes.

13. An optoelectric angle-measuring device according to claim 10, wherein the illumination device is arranged so that the code carrier is illuminated from the inside or from the outside.

14. An optoelectric angle-measuring device according to claim 1, wherein the position code is in the form of a self-illuminating code.

15. An optoelectric angle-measuring device according to claim 14, wherein the position code has a multiplicity of organic light emitting diodes.

16. A method of geodesic measurement, comprising:
    performing a geodesic measurement using an optoelectric angle-measuring device according to claim 1.

* * * * *